US006452804B1

(12) United States Patent
Dibene, II et al.

(10) Patent No.: US 6,452,804 B1
(45) Date of Patent: Sep. 17, 2002

(54) METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE

(75) Inventors: Joseph T. Dibene, II, Oceanside, CA (US); David H. Hartke, Durango, CO (US)

(73) Assignee: INCEP Technologies, Inc., San Diego, CA (US)

( * ) Notice: Subject to any disclaimer, the term of this patent is extended or adjusted under 35 U.S.C. 154(b) by 0 days.

(21) Appl. No.: 09/802,329

(22) Filed: Mar. 8, 2001

Related U.S. Application Data

(63) Continuation-in-part of application No. 09/798,541, filed on Mar. 2, 2001, and a continuation-in-part of application No. 09/785,892, filed on Feb. 16, 2001, and a continuation-in-part of application No. 09/727,016, filed on Nov. 28, 2000, and a continuation-in-part of application No. 09/432,878, filed on Nov. 2, 1999, and a continuation-in-part of application No. 09/353,428, filed on Jul. 15, 1999.

(60) Provisional application No. 60/187,777, filed on Mar. 8, 2000, provisional application No. 60/196,059, filed on Apr. 10, 2000, provisional application No. 60/219,813, filed on Jul. 21, 2000, provisional application No. 60/232,971, filed on Sep. 14, 2000, provisional application No. 60/251,222, filed on Dec. 4, 2000, provisional application No. 60/251,223, filed on Dec. 4, 2000, provisional application No. 60/251,184, filed on Dec. 4, 2000, provisional application No. 60/266,941, filed on Feb. 6, 2001, provisional application No. 60/222,386, filed on Aug. 2, 2000, and provisional application No. 60/222,407, filed on Aug. 2, 2000.

(51) Int. Cl.⁷ ................................................ H05K 7/20
(52) U.S. Cl. .................. 361/720; 361/704; 361/707; 361/700; 361/711; 361/719; 361/784; 361/785; 361/790; 257/715; 257/718; 257/719; 257/726; 257/727; 174/15.2; 174/16.3; 165/80.3; 165/80.4; 165/104.33; 165/185
(58) Field of Search ................................ 361/688–690, 361/694–699, 702–704, 707, 709, 717–721, 760, 784; 257/706, 717–727; 174/16.1, 16.3; 165/80.2, 80.3, 164.33, 185

(56) References Cited

U.S. PATENT DOCUMENTS 5,734,555 A * 3/1998 McMahon .................. 361/704

* cited by examiner

Primary Examiner—Boris Chervinsky
(74) Attorney, Agent, or Firm—Gates & Cooper LLP

(57) ABSTRACT

A stack up assembly for supplying power and removing heat from a microprocessor while controlling electromagnetic emissions is disclosed. The stack up assembly comprises a VRM circuit board or power regulation module, having a first side and a second side; a thermally conductive plate such as a vapor plate having a first side and a second side, wherein the thermally conductive plate first side is thermally coupled to the second side of the VRM circuit board; and a microprocessor having a first side and a second side, the microprocessor first side thermally coupled to the vapor plate second side.

20 Claims, 3 Drawing Sheets

METHOD AND APPARATUS FOR THERMAL AND MECHANICAL MANAGEMENT OF A POWER REGULATOR MODULE AND MICROPROCESSOR IN CONTACT WITH A THERMALLY CONDUCTING PLATE

CROSS-REFERENCE TO RELATED APPLICATIONS

This application claims benefit of the following U.S. Provisional Patent Applications, each of which are incorporated by reference herein:

Application Ser. No. 60/187,777, entitled "NEXT GENERATION PACKAGING FOR EMI CONTAINMENT, POWER DELIVERY, AND THERMAL DISSIPATION USING INTER-CIRCUIT ENCAPSULATED PACKAGING TECHNOLOGY," by Joseph T. DiBene II and David H. Hartke, filed Mar. 8, 2000;

Application Ser. No. 60/196,059, entitled "EMI FRAME WITH POWER FEED-THROUGHS AND THERMAL INTERFACE MATERIAL IN AN AGGREGATE DIAMOND MIXTURE," by Joseph T. DiBene II and David H. Hartke, filed Apr. 10, 2000;

Application Ser. No. 60/219,813, entitled "HIGH CURRENT MICROPROCESSOR POWER DELIVERY SYSTEMS," by Joseph T. DiBene II, filed Jul. 21, 2000;

Application Ser. No. 60/222,386, entitled "HIGH DENSITY CIRCULAR 'PIN' CONNECTOR FOR HIGH SPEED SIGNAL INTERCONNECT," by David H. Hartke and Joseph T. DiBene II, field Aug. 2, 2000.

Application Ser. No. 60/222,407, entitled "VAPOR HEATSINK COMBINATION FOR HIGH EFFICIENCY THERMAL MANAGEMENT," by David H. Hartke and Joseph T. DiBene II, filed Aug. 2, 2000;

Application Ser. No. 60/232,971 entitled "INTEGRATED POWER DISTRIBUTION AND SEMICONDUCTOR PACKAGE," by Joseph T. DiBene II and James J. Hjerpe, filed Sep. 14, 2000;

Application Ser. No. 60/251,222, entitled "INTEGRATED POWER DELIVERY WITH FLEX CIRCUIT INTERCONNECTION FOR HIGH DENSITY POWER CIRCUITS FOR INTEGRATED CIRCUITS AND SYSTEMS," by Joseph T. DiBene II and David H. Hartke, filed Dec. 4, 2000;

Application Ser. No. 60/251,223, entitled "MICRO-I-PAK FOR POWER DELIVERY TO MICROELECTRONICS," by Joseph T. DiBene II and Carl E. Hoge, filed Dec. 4, 2000;

Application Ser. No. 60/251,184, entitled "MICROPROCESSOR INTEGRATED PACKAGING," by Joseph T. DiBene II, filed Dec. 4, 2000; and Application Ser. No. 60/266,941, entitled "MECHANICAL INTERCONNECTION TECHNOLOGIES USING FLEX CABLE INTERCONNECT FOR POWER DELIVERY IN 'INCEP' INTEGRATED ARCHITECTURES," by David Hartke, James M. Broder, and Joseph T. DiBene II, filed Feb. 6, 2001.

This patent application is also continuation-in-part of the following co-pending and commonly assigned patent applications, each of which applications are hereby incorporated by reference herein:

Application Ser. No. 09/353,428, entitled "INTER-CIRCUIT ENCAPSULATED PACKAGING," by Joseph T. DiBene II and David H. Hartke, filed Jul. 15, 1999;

Application Ser. No. 09/432,878, entitled "INTER-CIRCUIT ENCAPSULATED PACKAGING FOR POWER DELIVERY," by Joseph T. DiBene II and David H. Hartke, filed Nov. 2, 1999;

Application Ser. No. 09/727,016, entitled "EMI CONTAINMENT USING INTER-CIRCUIT ENCAPSULATED PACKAGING TECHNOLOGY" by Joseph T. DiBene II and David Hartke, filed Nov. 28, 2000;

Application Ser. No. 09/785,892 entitled "METHOD AND APPARATUS FOR PROVIDING POWER TO A MICROPROCESSOR WITH INTEGRATED THERMAL AND EMI MANAGEMENT," by Joseph T. DiBene II, David H. Hartke, James J. Hjerpe Kaskade, and Carl E. Hoge, filed Feb. 16, 2001; and Application Ser. No. 09/798,541 entitled "THERMAL/MECHANICAL SPRINGBEAM MECHANISM FOR HEAT TRANSFER FROM HEAT SOURCE TO HEAT DISSIPATING DEVICE," by Joseph T. DiBene II, David H. Hartke, Wendell C. Johnson, and Edward J. Derian, filed Mar. 2, 2001.

This patent application is also related to application Ser. No. 09/801,437 entitled "METHOD AND APPARATUS FOR DELIVERING POWER TO HIGH PERFORMANCE ELECTRONIC ASSEMBLIES" by Joseph T. DiBene II, David H. Hartke, Carl E. Hoge, James M. Broder, Edward J. Derian, Joseph S. Riel, and Jose B. San Andres, filed on Mar. 8, 2001, which application is hereby incorporated by reference herein.

BACKGROUND OF THE INVENTION

1. Field of the Invention

The present invention relates to electronic systems, and in particular to a system and method for managing thermal power dissipation utilizing a thermally conducting plate such as, but not limited to a vapor plate that is thermally and mechanically connected to a microprocessor and a power regulator module.

2. Description of the Related Art

Vapor plates are extremely efficient configurations for providing thermal power dissipation in small form factors. Vapor plates have been used for many years in a variety of applications to remove thermal power from heat generating entities including electronic circuits. The vapor plate relies on vaporization and condensation of a liquid in a closed system eliminating the need for an external reservoir or flowing liquid. Also, because the temperature difference between the vaporization zone of the vapor plate and the condensation zone is usually very small, (several degrees centigrade) thermal conductivity can be as much as two orders of magnitude greater than phonon conduction through condensed media such as solid copper plates.

Although vapor plates are highly desirable from the standpoint of thermal power dissipation for microelectronic applications requiring form factor minimization, the comparative cost between the vapor plate and conventional, finned heatsinks with solid metallic bases is often prohibitive. Also, for systems requiring multiple thermal power dissipation paths, the vapor plate must often be dedicated to thermal power dissipation from only one component such as a microprocessor.

In high-performance desktop or high-end workstation/servers, high-speed microprocessor packaging must be designed to provide increasingly small form-factors. Meeting end user performance requirements with minimal form-factors while increasing reliability and manufacturability presents significant challenges in the areas of power distribution, thermal management, and electromagnetic interference (EMI) containment.

To increase reliability and reduce thermal dissipation requirements, newer generation processors are designed to operate with reduced voltage and higher current. Unfortunately, this creates a number of design problems.

First, the lowered operating voltage of the processor places greater demands on the power regulating circuitry and the conductive paths providing power to the processor. Typically, processors require supply voltage regulation to within 10% of nominal. In order to account for impedance variations in the path from the power supply to the processor itself, this places greater demands on the power regulating circuitry, which must then typically regulate power supply voltages to within 5% of nominal.

Lower operating voltages have also lead engineers away from centralized power supply designs to distributed power supply architectures in which power is bused where required at high voltages and low current, where it is converted to the low-voltage, high-current power required by the processor from nearby power conditioning circuitry.

While it is possible to place power conditioning circuitry on the processor package itself, this design is difficult to implement because of the unmanageable physical size of the components in the power conditioning circuitry (e.g. capacitors and inductors), and because the addition of such components can have a deleterious effect on processor reliability. Such designs also place additional demands on the assembly and testing of the processor packages as well.

Further exacerbating the problem are the transient currents that result from varying demands on the processor itself. Processor computing demands vary widely over time, and higher clock speeds and power conservation techniques such as clock gating and sleep mode operation give rise to transient currents in the power supply. Such power fluctuations can require changes of hundreds of amps within a few nanoseconds. The resulting current surge between the processor and the power regulation circuitry can create unacceptable spikes in the power supply voltage (e.g.

$$dv = IR + L\frac{di}{dt}\bigg).$$

Thermal management must also take nearby voltage regulator efficiencies into account. An 85% efficient voltage regulator driving a 130 watt device dissipates over 20 watts. This makes it more difficult to locate the voltage regulator close to the processor because the thermal management structures for each component conflict. The need for higher performance and increased functional integration in smaller processor dies has also lead to higher heat-flux concentrations in certain areas of the processor die. In some cases, the resulting surface energy densities approach unmanageable levels. Processor reliability is exponentially dependent on the operating temperature of the die junction. Lowering temperatures in the order of 10–15 degrees centigrade can double the processor lifespan. Thermal management issues now present some of the largest obstacles to increases in processor speed and miniaturization of the processor package.

SUMMARY OF THE INVENTION

To address the requirements described above, the present invention discloses a stack up assembly. The stack up assembly comprises a VRM circuit board or power regulation module, having a first side and a second side; a thermally conductive plate such as a vapor plate having a first side and a second side, wherein the thermally conductive plate first side is thermally coupled to the second side of the VRM circuit board; and a microprocessor having a first side and a second side, the microprocessor first side thermally coupled to the vapor plate second side.

The power regulator module, vapor chamber and microprocessor are configured in a three dimensional architecture that utilizes and extends the capability of a low cost, coaxial interconnection with power standoffs and modifications thereof, by physically integrating the high current delivery capability of the power standoffs into custom designed power regulators to provide self-contained and physically separable power delivery modules.

The three dimensional architecture of this invention thermally and mechanically connects the thermally conducting plate to both the microprocessor and the power regulator using thermal interface materials. Also, the three dimensional architecture configures a custom designed, electrically conductive frame and associated fittings and hardware that encases the microprocessor, power delivery module and other circuits to minimize and contain EMI within the package rather than within the chassis in a configuration that minimizes the overall form factor.

BRIEF DESCRIPTION OF THE DRAWINGS

Referring now to the drawings in which like reference numbers represent corresponding parts throughout.

DETAILED DESCRIPTION OF PREFERRED EMBODIMENTS

Figure 1:
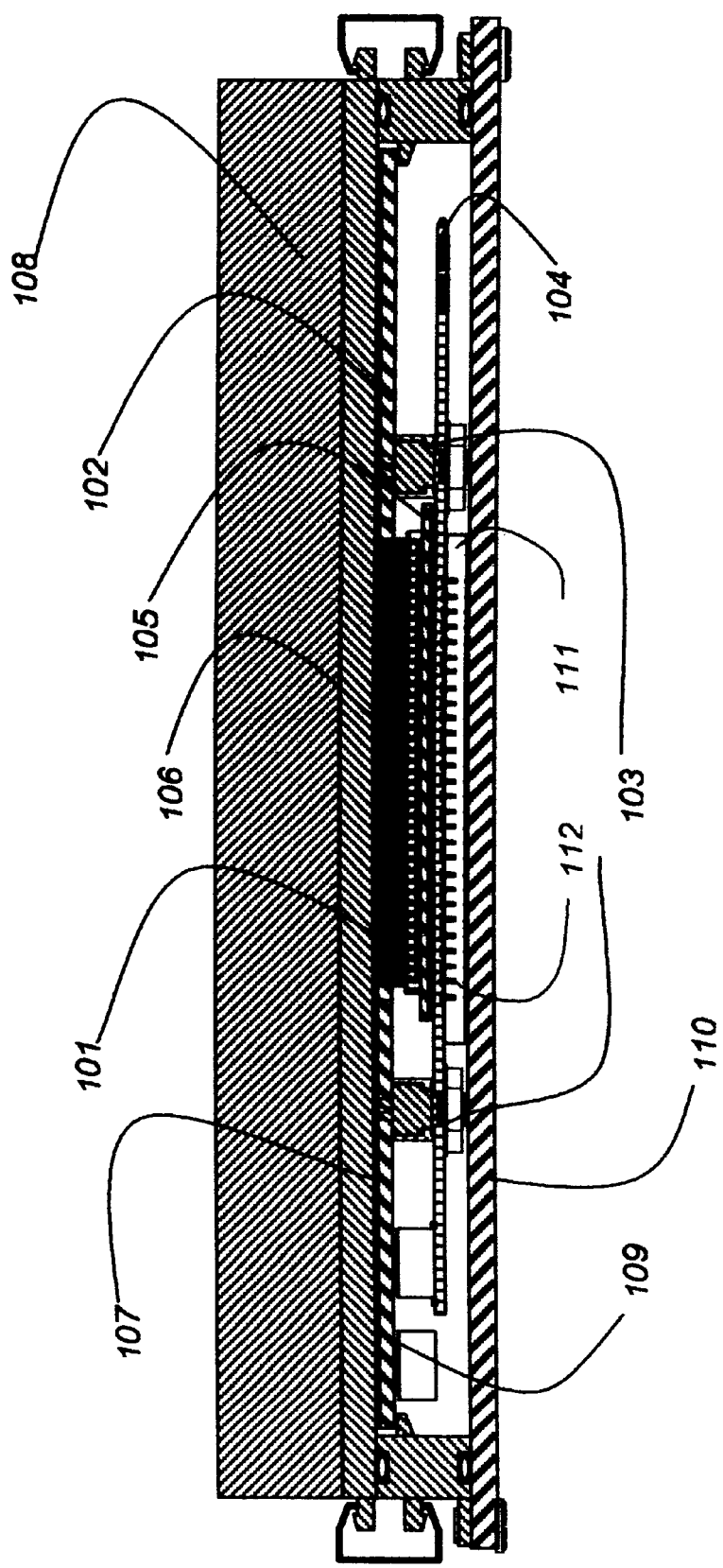
FIG. 1 is a diagram showing a microprocessor architecture configuration known as an i-Pack.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

To address the requirements described above, the present invention discloses a modular three dimensional configuration including an electronic circuit such as a microprocessor mounted to a multilayer circuit board or substrate such as, but not limited to, an Organic Land Grid Array (OLGA) or a Ceramic Land Grid Array (CLGA) or Low Temperature Co-fired Ceramic (LTCC) using C-4 (controlled collapse chip connection) technology. Typically, the circuit board is populated with external, metallized lands on the surface opposite the microprocessor chip. This circuit board is usually bonded to an interposer board that is populated with an array of metal pins on the opposite surface that can be connected to a socket that is surface mounted onto a motherboard. Typically, power is delivered to the microprocessor from an externally configured power regulator through the motherboard, the socket, the interposer board, the OLGA and finally to the microprocessor chip.

In one embodiment of this invention, the assembly described above is flipped upside down so as to configure the microprocessor C-4 side up. Because thermal power dissipation typically requires a finned heatsink and associated blower or fan, this configuration is not conducive for conventional cooling schemes. Instead, the inverted back surface of the microprocessor chip is mounted directly against a vapor plate using a compliant, thermally conductive polymeric material that may contain an inorganic second phase to provide enhanced thermal conductivity. The vapor plate can be configured to accommodate at least one microprocessor circuit. For multiple microprocessor configurations, both microprocessor circuits may be connected to the same motherboard but as one embodiment of this invention each microprocessor circuit can be configured with a separate power regulator module.

The three dimensional configuration described in this invention further includes a power regulator module that is populated with a plurality of coaxial conductors that function in part as non-compressible conductive standoffs that are used to mount the power regulator board to the interposer substrate. This embodiment provides a modular package in which the mechanical standoffs serve many purposes. First, they provide a low inductance path directly to the interposer board located in close proximity to the microprocessor, rather than the higher inductance path through the motherboard substrate, socket and other elements of the electrical path. Second, they provide a proper z-axis (typically vertical) physical relationship between the substrate and the circuit board. The modular assembly can be plugged into a socket on the motherboard, and all of the pins on the socket can be used as signal pins instead of power pins. This also allows the processor to be easily separated from the motherboard, even while providing power, if desired.

Because the power regulator module can be configured in close proximity to the microprocessor, thermal power dissipation for the power regulator circuitry must be addressed at the package level rather than externally. For the embodiment described in this invention, the power regulator circuit board can be fabricated from a high thermal conductivity material or can be populated with thermal vias that transmit thermal power from the component side of the power regulator circuit board to the back surface. Further, the thermal vias are configured within the power regulator circuit board to provide a thermal power dissipation path from devices such as FET's that populate the power regulator circuit board. The back surface of the power regulator circuit board directly contacts the surface of the vapor plate on the opposite side of the microprocessor using a thermally conductive polymeric material. The power regulator module is physically located and held in place by the plurality of coaxial conductors that also function as mechanical standoffs and fasteners to mechanically connect the power regulator module to the interposer board. Also, the coaxial conductors provide a low inductance path directly to the microprocessor, rather than the higher inductance path through the substrate, socket and other interconnect elements. Additionally, they provide a the proper z-axis (typically vertical) physical relationship between the substrate and the circuit board.

In another embodiment of this invention, the vapor plate can be configured to provide physical feed through holes within the body of the vapor plate to permit pass-through of the coaxial conductors from the voltage regulator circuit board to the interposer board. The power regulator board can also be configured to locate the coaxial conductors outboard of the vapor plate while configuring the thermal power generating components of the power regulator module to physically align with thermally conducting vias within the circuit board to provide a thermal power dissipation path from these components to the vapor plate.

The present invention includes an architecture that differs from conventional microprocessor packaging architectures in that this architecture addresses all the significant off-chip requirements that affect the performance and reliability of the microprocessor using symbiotic relationships among architecture elements. The architecture uses a low cost, coaxial interconnection and physically integrates the high current delivery capability of the coaxial connection with custom designed power regulators to provide self-contained and physically separable power delivery modules that can be connected to interposer boards, OLGAs, CLGAs or other area array packages.

Also, microprocessor and power regulator thermal dissipation requirements are both satisfied by using a vapor plate configured to be physically located between the microprocessor back surface and the underside of the power regulator module. This configuration uniquely, provides a thermal power dissipation path for both sources of heat yet minimizes the form factor associated with power delivery and thermal power dissipation.

In one embodiment of this invention, the integrated architecture includes an electrically conductive frame and associated fittings and hardware that electrically couples with a stiffener board and the motherboard to encase the microprocessor, power delivery module and other circuits to minimize and contain EMI within the package rather than within the chassis. When compared with conventional methods of power delivery, thermal power dissipation, and EMI reduction the present invention boosts the volumetric form factor efficiency of the microprocessor. At the same time, signal integrity/performance, manufacturability, reliability and cost effectiveness are also improved. The architecture is suitable for the generation of three dimensional solutions for microprocessor and electronic circuits configurations that are pre-packaged on, or pre-connected to, interposer boards, OLGAs using BUM technology, CLGAs, Flip-Chip Pin Grid Arrays (FC-PGAs), Flip Chip Ball Grid Arrays (FC-BGAs), as well as other electronic circuits substrates and bare chips.

The architecture provides packaging solutions that include custom designed modules, interconnections and component hardware that are physically separable but can also be interconnected and combined to form connectable modules or packages that permits direct attachment of lidded or lidless substrates bonded to microprocessors or other electronic circuits including multi-chip modules. Also, the vapor plate can be configured with a variety of heat exchangers that are mechanically or remotely connected to the condensation portion of the vapor plate. A variety of blowers and air circulation devices and heat exchangers can be mechanically or metallurgically connected to the vapor plate to provide thermal power dissipation from the microprocessor, voltage regulator module and other components.

FIG. 1 shows a configuration for the architecture designated as i-PAK In this configuration, the microprocessor package (101) is oriented to have the C-4 connections facing downward which is the standard configuration for this form of interconnect technology. The power regulator module (102) and the coaxial conductors (103) are connected between power regulation module (or voltage regulation module, VRM (102) and the interposer board (104) upon which is bonded to the OLGA (105). A cutout in the power regulation module (102) provides a feed-through for a spacer plate (106) that conducts heat from the back surface of the microprocessor package (101) to an integrated heatsink (107) which can be a vapor chamber or a metal plate connected to a finned heatsink (108). The circuit board of the power regulation module (102) is populated with thermal vias to permit thermal power transfer from components on the power regulation module (102) to the integrated heatsink (107) using a thermally conducting polymeric material (109). The motherboard (110) is shown connected to the side opposite the integrated heatsink (107). A socket (111) having a plurality of pins (112) electrically coupled to the microprocessor (101) is disposed between the interposer board (104) and the motherboard (110).

In this configuration, the microprocessor package (101) and power regulation module (102) are located on the same side of the integrated heatsink (107) and because the power regulation module (102) is physically located above the microprocessor package (101) a cutout is required in the power regulation module (102) through which the spacer plate (106) must be inserted to provide a thermal power dissipation path to the integrated heatsink (107) which also acts as the thermal power dissipation path for the power regulation module (102).

Figure 2:
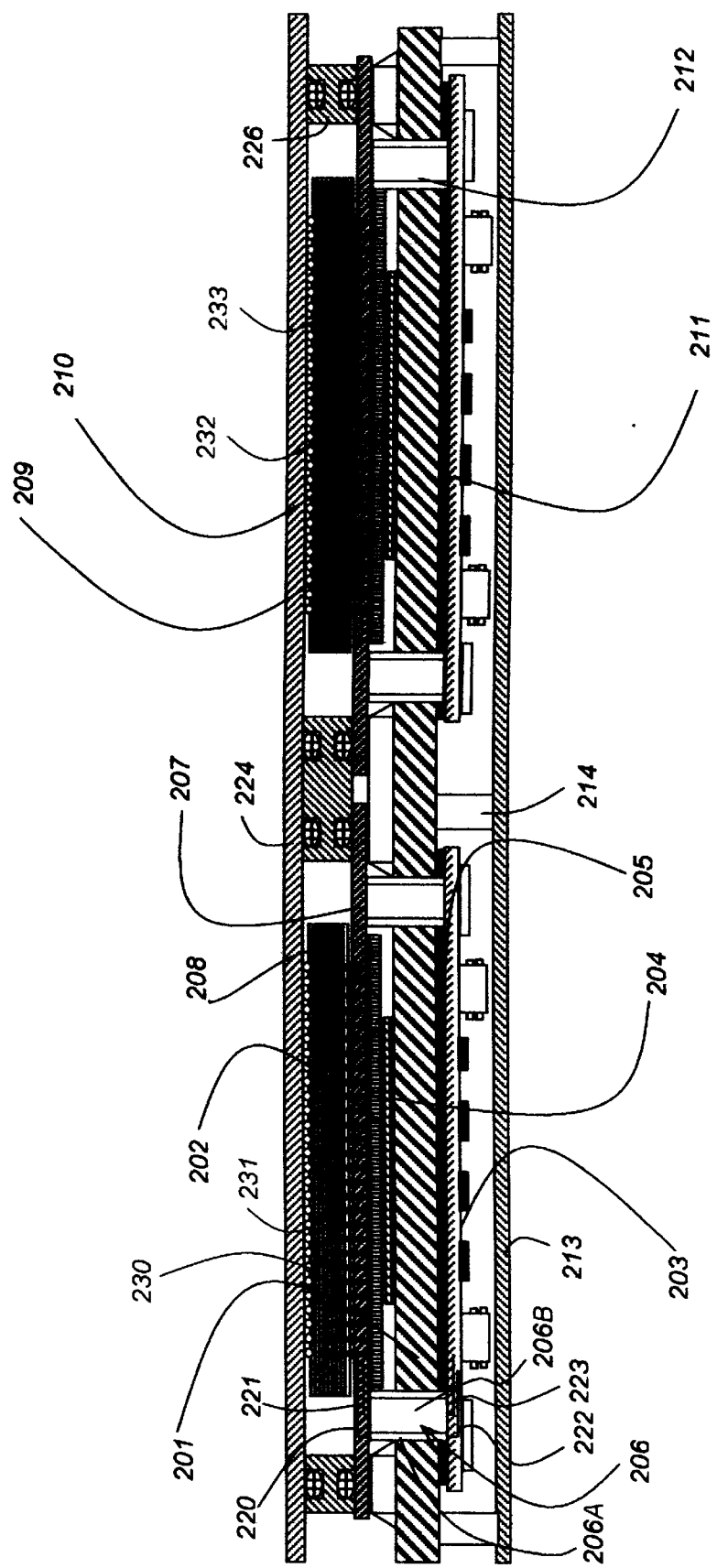
FIG. 2 is a diagram illustrating one embodiment of the present invention including a vapor plate positioned between a back surface of a microprocessor chip and an underside of a power regulator module.

FIG. 2 shows the configuration of the embodiment of this invention wherein a thermally conductive plate such as a vapor plate (201) is positioned between the back surface of the microprocessor chip (202) and the underside of the power regulator module (203). A thermally conducting polymer layer (204) provides a continuous thermal power dissipation path between the microprocessor chip (202) and the vapor plate (201). Similarly, the thermally conducting polymer layer (205) provides a continuous thermal power dissipation path between the power regulation module (203) and the vapor plate (201).

As described in the commonly-assigned patent applications set forth herein, the coaxial conductors (206) are power transmitting standoffs that provide electrical continuity between the power regulator module (102) and the interposer board (207). The power conducting standoffs (206) include a first portion (206 B) electrically coupling the interposer circuit board power plane (221) and the VRM power plane (223) and a second portion (206 A) electrically coupling the interposer circuit board ground plane (220) and the VRM ground plane (222). The coaxial conductors (206) provide a low inductance path for power delivery from the power regulation module (203) to the microprocessor chip (202) through an interposer circuit board (207) and the OLGA substrate (208).

FIG. 2 is configured with two microprocessor chips (202) and (209) in the same module. Both the microprocessor chips (202) and (209) are connected to the vapor plate (201) using thermally conductive devices (204) and (210). Microprocessor chip (209) is configured with a separate power regulator module (211) and coaxial conductors (212). Microprocessor chips (202) and (209) form an integrated multichip module configured with one vapor plate (201). A first socket (230) having a plurality of pins (231) electrically coupled to the microprocessor chip (202) and the motherboard (224) is disposed between the interposer board (207) and the motherboard (224). Further, a second socket (232) having a plurality of pins (233) electrically coupled to the second microprocessor chip (209) and the motherboard (224) is disposed between an interposer board (207) and the motherboard (224).

FIG. 2 also illustrates the use of thermally conductive members (214) to conduct heat away from the vapor plate (201) to a plate (213), and the arrangement of the foregoing elements with respect to the motherboard (224), and a frame structure (226).

Figure 3:
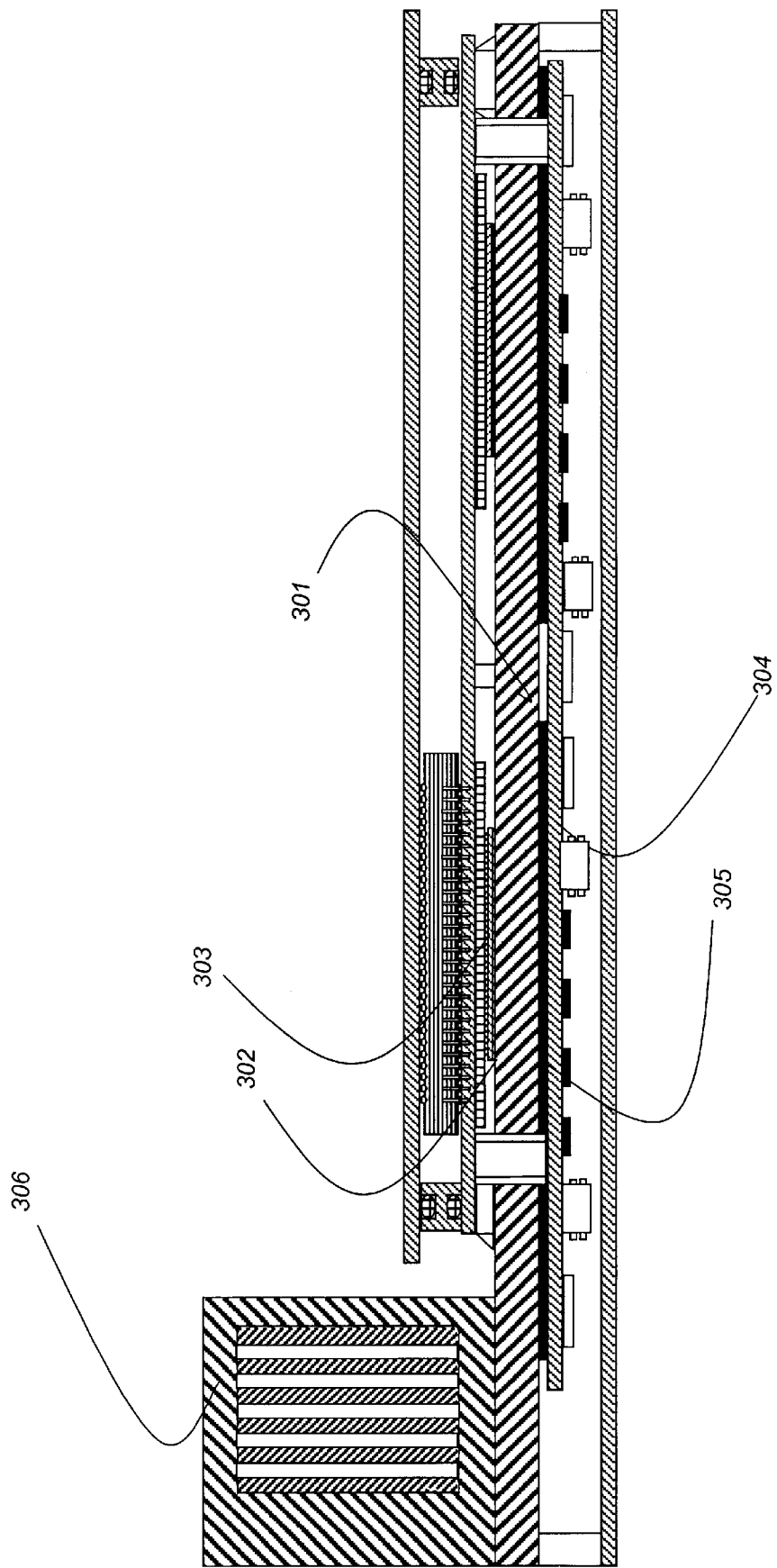
FIG. 3 is a diagram illustrating another embodiment of the invention wherein the vapor plate is used with more than one microprocessor and interposer board.

FIG. 3 shows another view wherein the vapor plate (301) is configured to contact a thermally conducting polymeric material (302) located on the back surface of a microprocessor circuit (303) to provide a direct thermal power dissipation path from the back surface of a microprocessor (303) to the vapor plate (301). Also, the vapor plate (301) is configured to be physically located between the microprocessor (303) and a power regulator module (304) to simultaneously contact a thermally conductive material (305) to provide a direct thermal power dissipation path from the back surface of (304) to (301).

The vapor plate (301) is connected to a heat exchanger (306) which can be a high surface area medium that dissipates the latent heat of condensation from the vapor plate condenser zone. Typically the heat exchanger (306) is selected to provide high thermal power dissipation in a small form factor apparatus such as, but not limited to, a heat fin, a blower or other high efficiency heat exchanger. The heat exchanger (306) can be physically and mechanically attached to the vapor plate (301) in the condenser zone using metallurgical brazing techniques and for certain applications, connection can be accomplished using a thermally conductive polymer configured with mechanical clamps and fasteners to mechanically and thermally connect the heat exchanger (306) to the vapor plate (301).

Conclusion

This concludes the description of the preferred embodiments of the present invention. In summary, the invention describes an arrangement such that a VRM, and mircoprocessor are co-located and thermally coupled to the same heat exchanger. This arrangement reduces the amount of space required in the z (vertical) axis. The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A stack up assembly, comprising:
    a voltage regulation module ((VRM) circuit board having a first side and a second side;
    a thermally conductive plate having a first side and a second side, wherein the thermally conducive plate first side is disposed on and thermally coupled to the second side of the VRM circuit board and
    a microprocessor, having a first side and a second side, the microprocessor first side disposed on and thermally coupled to the thermally conductive plate second side;
    a socket, physically coupled to the second side of the microprocessor, the socket having a plurality of pins electrically coupled to the microprocessor; and
    an interposer circuit board, electrically coupled to the pins and coupled between the socket and the second side of the microprocessor.

2. The stack up assembly of claim 1, wherein the thermally conductive plate is a vapor plate.

3. The stack up assembly of claim 1, wherein the microprocessor is electrically coupled to the interposer circuit board by an organic land grid array.

4. The stack up assembly of claim 1, wherein the socket is electrically coupled to a motherboard.

5. The stack up assembly of claim 1, wherein the first side of the microprocessor faces in a downward direction.

6. The stack up assembly of claim 4, wherein the vapor plate is thermally coupled to a plate via thermal standoffs.

7. The stack up assembly of claim 1, wherein the VRM circuit board includes electrical components mounted on the first side.

8. The stack up assembly of claim 1, further comprising a thermally conductive material displaced between the microprocessor and the thermally conductive plate.

9. The stack up assembly of claim 1, further comprising:
at least one power transmitting mechanical standoff, disposed between the VRM circuit board and the interposer board, providing electrical continuity between the VRM circuit board and the interposer board.

10. The stack up assembly of claim 9, wherein:
the interposer circuit board includes a power plane and a ground plane;
the VRM board includes a power plane and a ground plane;
the power transmitting mechanical standoff includes
a first portion electrically coupling the interposer power plane and the VRM power plane; and
a second portion, coaxial disposed in relation to the first portion electrically coupling the interposer ground plane and the VRM power plane.

11. The stack up assembly of claim 10, further comprising:
a second VRM circuit board having a first side and a second side, wherein the thermally conductive plate first side is thermally coupled to the second side of the second VRM circuit board;
a second microprocessor, having a first side and a second side, the microprocessor first side thermally coupled to the vapor plate second side.

12. The stack up assembly of claim 11, further comprising a frame, substantially surrounding the first VRM circuit board, the second VRM circuit board, the first microprocessor and the second microprocessor.

13. The stack up assembly of claim 12, wherein the frame is electrically and mechanically coupled to a motherboard.

14. The stack up assembly of claim 13, wherein the frame is further electrically and mechanically coupled to a plate, wherein the frame, plate, and motherboard, thus form a three dimensional electrically grounded structure substantially containing electromagnetic interference.

15. The stack up assembly of claim 14, wherein the thermally conductive plate extends external to the frame.

16. The stack up assembly of claim 15, further comprising a heat exchanger thermally coupled to the thermally conductive plate.

17. The stack up assembly of claim 16, wherein the heat exchanger is mechanically bonded to the thermally conductive plate.

18. The stack up assembly of claim 17, wherein the heat exchanger is brazed to the thermally conductive plate.

19. The stack up assembly of claim 17, wherein the heat exchanger is soldered to the thermally conductive plate.

20. The stack up assembly of claim 17, wherein the heat exchanger is thermally coupled to the thermally conductive plate by a thermally conductive polymer.

* * * * *